(12) United States Patent
Lamy et al.

(10) Patent No.: US 9,728,337 B2
(45) Date of Patent: Aug. 8, 2017

(54) METHOD FOR PRODUCING A CAPACITOR

(71) Applicants: COMMISSARIAT A L'ENERGIE ATOMIQUE ET AUX ENERGIES ALTERNATIVES, Paris (FR); STMICROELECTRONICS SA, Montrouge (FR)

(72) Inventors: Yann Lamy, Saint Etienne de Crossey (FR); Olivier Guiller, Grenoble (FR); Sylvain Joblot, Bizonnes (FR)

(73) Assignees: COMMISSARIAT A L'ENERGIE ATOMIQUE ET AUX ENERGIES ALTERNATIVES, Paris (FR); STMICROELECTRONICS SA, Montrouge (FR)

( * ) Notice: Subject to any disclaimer, the term of this patent is extended or adjusted under 35 U.S.C. 154(b) by 53 days.

(21) Appl. No.: 14/416,978

(22) PCT Filed: Jul. 12, 2013

(86) PCT No.: PCT/EP2013/064863
§ 371 (c)(1),
(2) Date: Jan. 23, 2015

(87) PCT Pub. No.: WO2014/016147
PCT Pub. Date: Jan. 30, 2014

(65) Prior Publication Data
US 2015/0206662 A1     Jul. 23, 2015

(30) Foreign Application Priority Data
Jul. 25, 2012  (FR) ...................... 12 57227

(51) Int. Cl.
*H01G 4/30*     (2006.01)
*H05K 1/18*     (2006.01)
(Continued)

(52) U.S. Cl.
CPC ............... *H01G 4/306* (2013.01); *H01G 4/33* (2013.01); *H01G 4/38* (2013.01); *H01L 28/87* (2013.01); *H01L 28/91* (2013.01); *H05K 1/181* (2013.01)

(58) Field of Classification Search
None
See application file for complete search history.

(56) References Cited

U.S. PATENT DOCUMENTS

| | | |
|---|---|---|
| 6,613,641 B1 | 9/2003 | Volant et al. |
| 8,085,524 B2 | 12/2011 | Roozeboom et al. |

(Continued)

FOREIGN PATENT DOCUMENTS

| | | |
|---|---|---|
| EP | 1 511 070 A2 | 3/2005 |
| EP | 1 953 778 A1 | 8/2008 |
| JP | 2008-251878 A | 10/2008 |

OTHER PUBLICATIONS

International Search Report issued Jan. 29, 2014 in PCT/EP2013/064863 Filed Jul. 12, 2013.

(Continued)

*Primary Examiner* — Shamim Ahmed
(74) *Attorney, Agent, or Firm* — Oblon, McClelland, Maier & Neustadt, L.L.P.

(57) ABSTRACT

A method for producing a capacitor stack in one portion of a substrate, the method including: forming a cavity along a thickness of the portion of the substrate from an upper face of the substrate, depositing a plurality of layers contributing to the capacitor stack onto the wall of the cavity and onto the surface of the upper face, and removing matter from the layers until the surface of the upper face is reached. The forming of the cavity includes forming at least one trench and, associated with each trench, at least one box. The at least one trench includes a trench outlet that opens into the (Continued)

box. The box includes a box outlet that opens at the surface of the upper face, and the box outlet being shaped to be larger than the trench outlet.

26 Claims, 8 Drawing Sheets

(51) Int. Cl.
    *H01G 4/33* (2006.01)
    *H01G 4/38* (2006.01)
    *H01L 49/02* (2006.01)

(56) References Cited

U.S. PATENT DOCUMENTS

| | | | |
|---|---|---|---|
| 2002/0153551 A1* | 10/2002 | Wong | H01L 28/60 257/303 |
| 2002/0163029 A1 | 11/2002 | Dirnecker et al. | |
| 2003/0040161 A1* | 2/2003 | Schrenk | H01L 23/5223 438/393 |
| 2003/0203586 A1 | 10/2003 | Volant et al. | |
| 2004/0087101 A1* | 5/2004 | Balakumar | H01L 28/56 438/396 |
| 2005/0048762 A1 | 3/2005 | Hong | |
| 2005/0067701 A1* | 3/2005 | Coolbaugh | H01L 21/7687 257/751 |
| 2005/0139965 A1* | 6/2005 | Lee | C23C 16/40 257/632 |
| 2006/0234443 A1 | 10/2006 | Yang et al. | |
| 2007/0117313 A1 | 5/2007 | Yang et al. | |
| 2007/0158717 A1* | 7/2007 | Edelstein | H01L 21/76814 257/296 |
| 2009/0090998 A1 | 4/2009 | Woo | |
| 2009/0189249 A1 | 7/2009 | Woo | |
| 2011/0084360 A1 | 4/2011 | Kemerer et al. | |
| 2011/0156208 A1* | 6/2011 | Kaneko | H01L 21/7684 257/532 |
| 2011/0291235 A1 | 12/2011 | Xiao et al. | |
| 2012/0061798 A1 | 3/2012 | Wong et al. | |
| 2012/0104551 A1 | 5/2012 | Kemerer et al. | |
| 2013/0183805 A1 | 7/2013 | Wong et al. | |

OTHER PUBLICATIONS

French Preliminary Search Report issued Mar. 14, 2013 in Patent Application No. FR 1257227 Filed Jul. 25, 2012 (with English translation of categories of cited documents).

M. Thomas, et al., "Impact of TaN/Ta copper barrier on full PEALD TiN/Ta2O5/TiN 3D damascene MIM capacitor performance", IEEE, 2007, pp. 158-160.

* cited by examiner

METHOD FOR PRODUCING A CAPACITOR

TECHNICAL FIELD OF THE INVENTION

The present invention relates to the integration of three-dimensional capacitors (also referred to as 3D capacitors) provided in cavities etched within a substrate while maintaining a planar surface capacitor.

STATE OF THE ART 3D capacitors, such as MIM (Metal/Insulator/Metal) capacitors are widely used in integrated circuits. The technological interest of 3D capacitors lies in the fact that the capacitors can be stacked and have a surface developed in the (x, y) plane of the substrate but also along the z height/thickness, thus allowing a significant saving in space and a developed surface of the capacitor larger than a planar capacitor. For example, a MIM capacitor can be superimposed with active components.

The publication by Thomas et al. (IEEE 2007) entitled "Impact of TaN/Ta copper barrier on full PEALD TiN/Ta2O5/TiN 3D damascene—MIM capacitor performance" (M. Thomas, A. Farcy, E. Deloffre, M. Gros-Jean, C. Perrot D. Benoit, C. Richard, P. Caubet, S. Guillaumet, R. Pantel, B. Chenevrier, J. Torres, Proceedings of the IEEE 2007 International Interconnect Technology Conference—Digest of Technical Papers, Art. No. The publication by Thomas et al. (IEEE 2007) entitled "Impact of TaN/Ta copper barrier on full PEALD TiN/Ta2O5/TiN 3D damascene—MIM capacitor performance" (M. Thomas, A. Farcy, E. Deloffre, M. Gros-Jean, C. Perrot D. Benoit, C. Richard, P. Caubet, S. Guillaumet, R. Pantel, B. Chenevrier, J. Torres, Proceedings of the IEEE 2007 International Interconnect Technology Conference—Digest of Technical Papers, Art. No. 4263689, pp. 158-160) provides a realization of the integration of 3D capacitors, particularly MIM capacitors, at the end of the interconnection line, usually called "back-end-of-line" (BEOL) of a plate otherwise called "wafer". Four layers of respectively insulating, metallic, insulating and metallic materials are deposited onto the surface of a substrate, and also onto the wall of small sized trenches etched into the substrate.

The trenches are then filled with a conductive metal. Then, to leave the stack of three MIM layers in the trenches only, planarization, for example, a CMP, the acronym for "Chemical-mechanical planarization", polishing is performed to remove the MIM stack at the surface of the substrate. However, this process results in a loss relative to the total capacity due to CMP. As a matter of fact, the MIM stack only in the trenches participates in the capacity of the device, with the capacity of the substrate surface being lost.

The U.S. Pat. No. 8,085,524-B2 provides another method for producing a MIM capacitor integrated in a silicon substrate which is used as an electrode. Trenches are etched into the substrate. A (MIM or MIMIM) capacitor stack is then deposited onto the wall of the trenches. The layers of the capacitor stack are then etched one by one, which makes the method heavy, since lithography and etching must be executed for each layer. The method is thus long and costly.

In addition, new materials, such as a material having a high dielectric constant of the type known as "high-k" material, deposited into the capacitor stack is very difficult to etch, which significantly complicates the process of producing the capacitors using these.

SUMMARY OF THE INVENTION

The present invention wholly or partially remedies the drawbacks of the currently known techniques.

In particular, one aspect of the invention relates to a method for producing a capacitor comprising the forming of a capacitor stack in a portion of a substrate. The method includes the forming of a cavity along the thickness of the portion of the substrate from an upper surface of said substrate, the depositing of a plurality of layers contributing to the capacitor stack onto the wall of the cavity and onto the surface of the upper face and the removing of matter from the layers until the surface of the upper face is reached.

This method is characterized in that forming said cavity comprises forming at least one trench and at least one box associated with each trench. Said at least one trench has a trench outlet opening into the box, and said box comprises a box outlet opening at the surface of the upper face. The outlet of the box is formed to be larger than the trench outlet.

This produces a greater global capacitor and with a not purely vertical dimension (i.e. not only oriented along the thickness of the substrate). Doing so maintains the possibility of removing surface layers, optimized for example by CMP polishing. Advantageously, the widening produced by the box, at the substrate surface, may facilitate the connection of the capacitive elements to external components or to other capacitors.

Another aspect of the present invention relates to a microelectronic device comprising a substrate in a portion of which a cavity extends along the thickness of the substrate from an upper face of the substrate. The device comprises a capacitor stack comprising at least partly a capacitor and comprising a plurality of layers on the wall of the cavity and on the surface of the upper face.

The microelectronic device is characterized in that the cavity comprises at least one trench and, associated with each trench, of at least one box, with said at least one trench comprising a trench outlet that opens into the box, with said box comprising a box outlet that opens at the surface of the upper face, and the box outlet being shaped so as to be larger than the trench outlet.

Other aspects of embodiments of the invention also relate to a method wherein the forming of the box comprises the forming of a bottom wall of the box located in the same plane as the trench outlet and having a larger section than that of the trench outlet.

BRIEF DESCRIPTION OF THE FIGURES

The invention will be better understood in view of sheets of drawings integrated therein and which show advantageous but not limiting embodiments of the invention.

DETAILED DESCRIPTION

Figure 1:
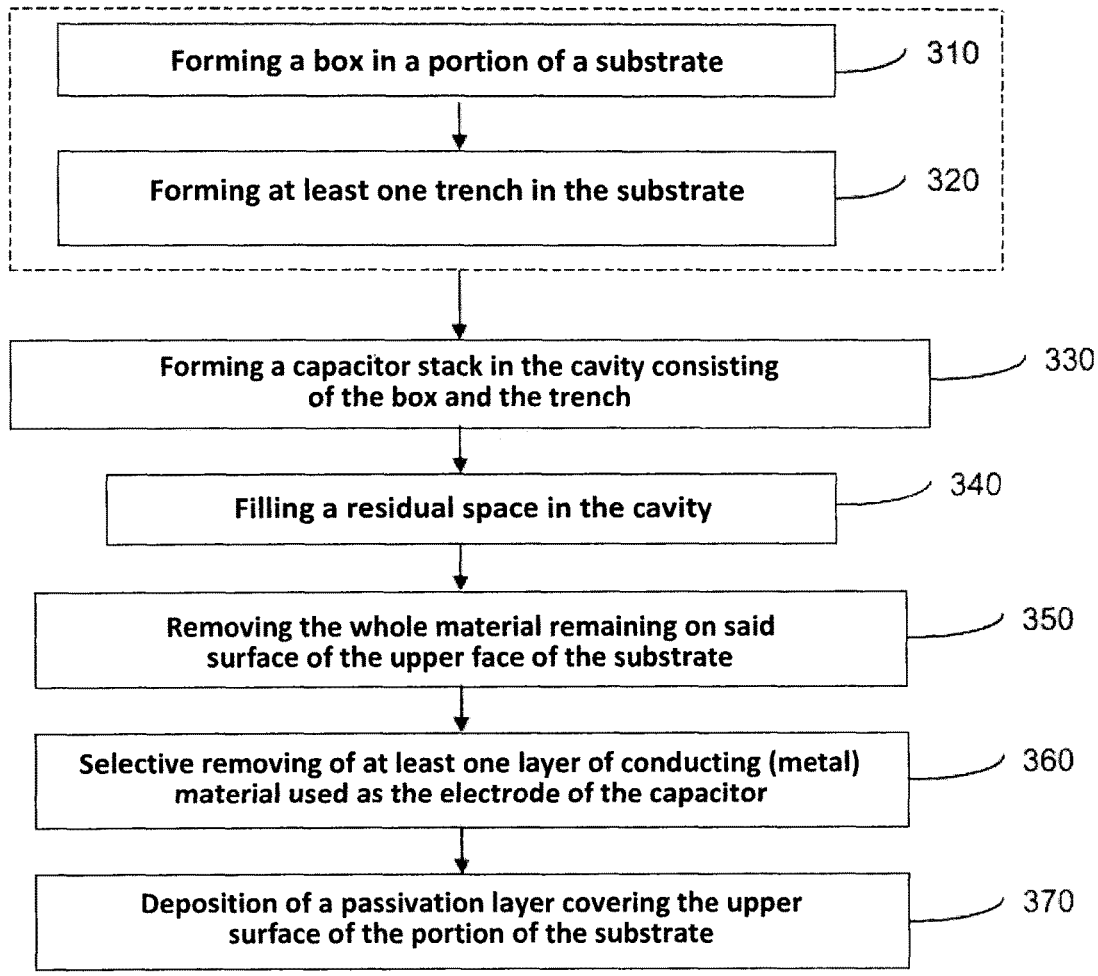
FIG. 1 summarizes the main steps of production of a capacitor according to a first embodiment of the method of the invention.

It should be noted that, within the scope of the present invention, the words "on" or "over" do not necessarily mean "in contact with". Thus, for instance, depositing a plurality of layers on a wall of a cavity does not necessarily mean that the plurality of layers and said wall are directly in contact with each other, but this means that the plurality of layers at least partially covers the wall by being either directly in contact therewith or by being separated therefrom by another layer or another element.

The term "upper" as used in particular to describe a face of the substrate is used here to designate a first one of the two faces of the substrate only (the other one being the lower face), without making any assumption about the relative position of the faces in a vertical direction. The upper face could also be named the front face, as opposed to a rear face.

The shape or size given for some components of the present invention are always indicative and shall be construed as including substantially equivalent forms and dimensions.

Before making a detailed review of the embodiments of the invention, optional characteristics which may be used in any combination or as alternative solutions are listed hereafter:

- the forming of the box comprises the forming of a bottom wall of the box located in the same plane as the trench outlet and having a larger section than that of the trench outlet.
- The box is formed as a rectangular or cylindrical parallelepiped, especially with a circular section, but such shapes are not limiting. Other shapes may also be used such as polygonal shapes.
- The at least one trench is formed with a circular section transversely to the thickness of the substrate.
- The at least one trench is formed with a rectangular or square cross section transversely to the thickness of the substrate.
- the box is formed with an aspect ratio smaller than 1 between the dimension thereof along the thickness of the portion of the substrate and the dimension thereof transverse to said thickness and wherein the at least one trench is formed with an aspect ratio greater than 1 between the dimension thereof along the thickness of the portion of the substrate and the dimension thereof transverse to said thickness.
- said plurality of layers comprises successively above the wall of the cavity, a first layer of conductive material so configured as to form at least a part of a bottom electrode of the capacitor, a second layer of insulating material and a second layer of conductive material which at least partly forms an upper electrode of the capacitor.
- a partial etching of a layer of conductive material is so configured that the layer of conductive material stops at a lower level than that of the second layer of insulating material along the thickness of the substrate.
- said plurality of layers comprises a layer of insulating material located above the wall of the cavity and under the first layer of conductive material.
- using the portion of the substrate as the lower electrode of the capacitor and wherein the deposition of said plurality of layers comprises successively above the wall of the cavity, depositing a layer of insulating material and a layer of conductive material which forms at least in part an upper electrode of the capacitor.
- a partial etching of a layer of conductive material is so configured that the layer of conductive material stops at a lower level than that of the second layer of insulating material along the thickness of the substrate.
- forming at least one additional capacitor stack by successive depositions, above a layer of conductive material of said capacitive stack so configured as to form at least a part of the upper electrode of the capacitive stack, an additional layer of insulating material and an additional layer of conductive material. Advantageously, the additional stacks are nested into each other.
- the forming of the box comprises the forming of a box side wall flaring towards the box outlet.—The forming of the box comprises the forming of a box side wall flaring towards the box outlet. In particular, the side wall has a tapered shape in at least one portion of the height of the box from a height level located closer to the trench outlet to a height level located closer to the box outlet. This forms a lateral widening while programming towards the box outlet.
- the forming of a flared box side wall comprises the forming, on the flared box side wall, of at least one landing at an intermediate level between the trench outlet and the box outlet along the thickness of the portion of the substrate, with the at least one landing being so configured as to define two box stages.
- The successive depositions of at least one additional capacitor stack are so configured as to preserve a residual space defined by said additional stack.
- as many box stages as capacitor stacks are formed.
- According to one embodiment, a first additional capacitor stack is formed over the layer of conductive material so configured as to form at least in part an upper electrode of the capacitor, and wherein the depth of the stage located directly under the box outlet along the thickness portion of the substrate is so selected as to be: greater than the sum of the thicknesses of the lower electrode of the capacitor and the second layer of insulating material; smaller than or equal to the thickness of the capacitor stack;
  and wherein the depth of the stage located directly under the stage located directly under the box outlet along the thickness portion of the substrate is so selected as to be: greater than the sum of the thicknesses of the upper electrode of the capacitor and the additional layer of insulating material of the first additional capacitor stack; smaller than or equal to the sum of the thicknesses of said first additional capacitor stack and the upper electrode of the capacitor.
- In another embodiment, a first additional capacitor stack is formed over the layer of conductive material so configured as to form at least in part an upper electrode of the capacitor, and wherein the depth of the stage located directly under the box outlet along the thickness of the portion of the substrate is selected so as to be: greater than the sum of the thicknesses of the upper electrode of the capacitor and the additional layer of insulating material of the first additional capacitor stack; smaller than or equal to the sum of the thicknesses of said first additional capacitor stack and the upper electrode of the capacitor; and wherein the depth of the stage located directly under the stage located directly under the box outlet along the thickness of portion substrate is selected so as to be: greater than the sum of the thicknesses of the lower electrode of the capacitor and the second layer of insulating material; smaller than or equal to the thickness of the capacitor stack.

For all second additional capacitor stack formed over the first additional capacitor stack, an additional stage is formed at a higher depth level relative than the upper stage corresponding to a previous capacitive stack, with the depth of the additional stage being so selected as to be:

greater than the sum of the thicknesses of the additional layer of conductive material of the previous additional capacitive stack and the additional layer of insulating material of said second additional capacitor stack;

smaller than or equal to the sum of the thicknesses of said second additional capacitor stack and the additional layer of conductive material of said previous additional capacitive stack.

The first layer of conductive material and the additional layer of conductive material of at least one additional capacitor stack are so electrically connected as to form the lower electrode.

The substrate and the additional layer of conductive material of at least one additional capacitor stack are so electrically connected as to form the lower electrode.

the deposition of the plurality of layers comprises the non-conforming deposition of at least one layer.

The non-conforming deposition is so configured that the deposition thickness of said at least one layer is greater in the box in a direction transverse to the thickness of the substrate than that of the deposition of said at least one layer in the trench.

From the upper face, a material for filling a residual space of the cavity is deposited after said deposition of the plurality of layers, and then the filling material and the plurality of layers are removed from the surface of the upper face.

The filling material may be conductive (e.g. a metal or a conductive polymer) as well as insulating (e.g. an insulating polymer).

Said removing comprises performing planarization by chemical-mechanical or mechanical polishing or CMP.

The portion of the substrate is formed in part with a surface layer of the substrate deposited on a bottom layer of the substrate prior to the forming of said cavity, and wherein the depth of the box along the thickness of the substrate is smaller than the thickness of said surface layer.

Conductive materials which may be used to form at least one electrode may be metallic and for example Cu or TaN or TiN or be a conductive polymer or a preferably doped semiconductor, for example, n-doped polysilicon.

The thickness of at least one layer of at least one capacitor stacks is smaller than 100 nm.

FIG. 1 summarizes the main steps of production of a capacitor 200 according to a first embodiment of the method of the invention. Steps 310, 320, 330, 340, 350, 360 and 370 are represented synthetically. They will be explained in greater details hereunder while referring to other figures.

FIGS. 2a to 2g describe the steps of the first embodiment according to the method of the invention. The capacitor 200 may be executed in any type of substrate, preferably silicon.

Figure 2A:
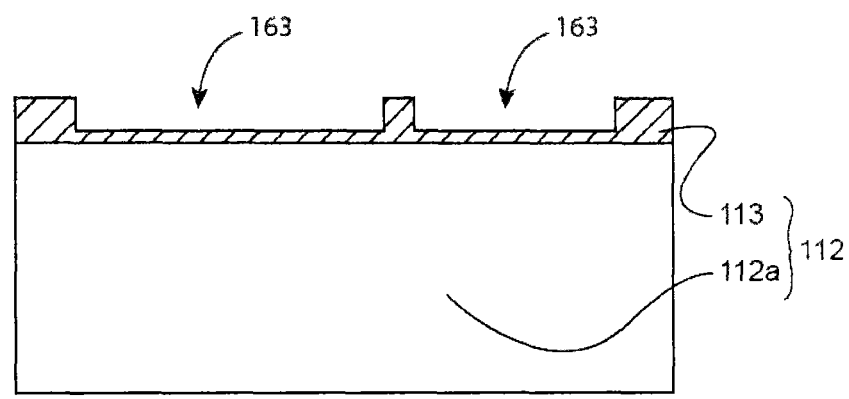
FIGS. 2a to 2g describe the steps of the first embodiment according to the method of the invention.

FIG. 2a illustrates the capacitor forming structure upon completion of the step 310. The step 310 consists in forming a box 163 by etching in a portion of a substrate 112. The purpose of forming the box 163, which needs not be very deep, is to keep intact a capacitor stack produced subsequently.

According to this embodiment, prior to forming the box 163, a surface layer of the substrate 113, for example silicon oxide, is deposited onto a lower layer 112a of the substrate 112. One aim of the deposition of the substrate surface layer 113 is to define a portion of the substrate wherein the box 163 will deeply extend, thus preferably having a depth smaller than the thickness of the surface layer 113. The depth of the box 163 is, for example, between 0.5 and 1 μm (micrometer).

The box 163 includes a box outlet that leads to the upper surface of the substrate 112. The box 163 for instance is shaped as a rectangular parallelepiped.

It should be noted that the deposition of the substrate surface layer 113 is not an essential step, in other words, the box 163 may very well be directly etched into the lower layer 112a of the substrate 112.

Figure 2B:
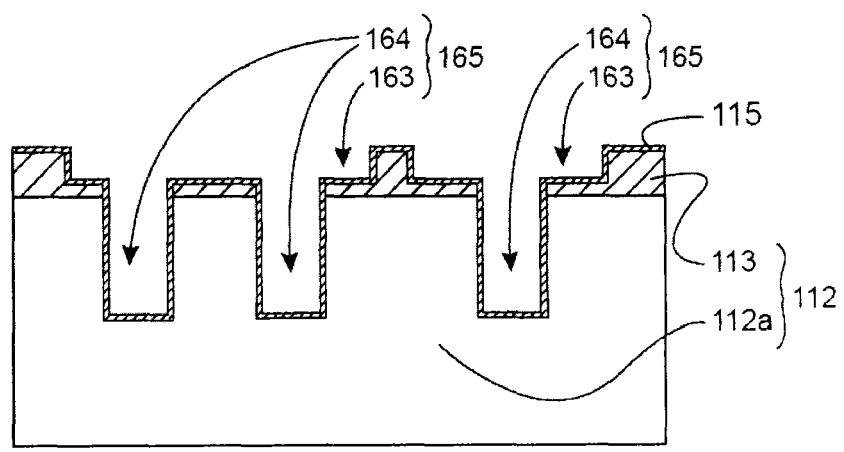

FIG. 2b illustrates the capacitor forming structure upon completion of the step 320. The step 320 consists in forming at least one trench 164 by etching a portion of the substrate 112 thus forming a trench outlet leading to the box 163. According to this embodiment, the at least one trench 164 is formed either with a rectangular cross-section or with a circular cross-section transversally to the thickness of the substrate 112. The depth of the at least one trench 164 is preferably between 30 and 200 μm. Besides, in order to ensure the greatest possible developed surface to increase the value of the capacitor 200, at least one trench 164 has a high aspect ratio, i.e., the aspect ratio is greater than 2.

The aim of the steps 310 and 320 is to form a cavity 165 for preserving a capacitor stack later. The structure of the cavity 165 makes it possible to best optimize the vertical and horizontal surfaces of the capacitor 200 in the developed in the cavity 165 and on the surface of the portion of the substrate 112. In addition, the execution of the steps 310 and 320 may be reversed. The assembly of the box 163 and the at least one trench 164 constitutes the cavity 165 along the thickness of the portion of the substrate 112 from an upper surface of said substrate 112.

The outlet of the box is formed to be larger than the outlet of the trench. Furthermore, the bottom wall of the box 163, located in the plane of said trench outlet, is larger than the trench outlet.

The box 163 is preferably formed with an aspect ratio smaller than 1 between the dimension along the thickness of the portion of the substrate 112 and its dimension transverse to said thickness and the at least one trench 164 is formed with an aspect ratio greater than 1 between the dimension along the thickness of the portion of the substrate 112 and its dimension transverse to said thickness.

In addition, a layer of insulating material 115 may be formed on the wall of the cavity 165 and the upper surface of the substrate 112 at this stage, more particularly using a passivation and for instance a deposition. The material of the layer of the insulating material 115 is the example SiO2.

It should be noted that this execution of the layer of insulating material 115 does not belong to the essential processes of this method. It can be considered, in some embodiments, as a layer of a capacitor stack most of which is made subsequently, in the next step 330.

Figure 2C:
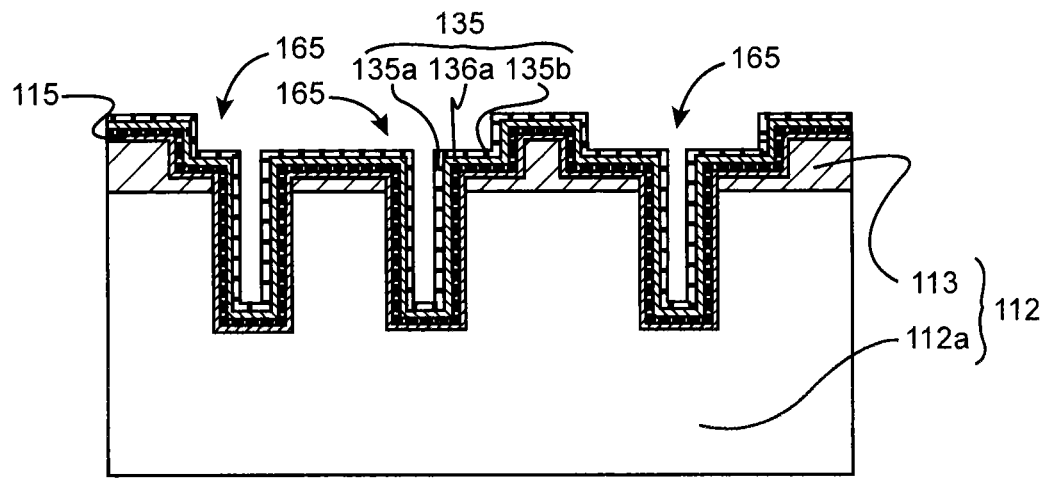

FIG. 2c illustrates the capacitor forming structure upon completion of the step 330. The step 330 consists in depositing a plurality of layers involved in the capacitor stack mentioned above on the wall (i.e. the edges (i.e. the faces) and on the bottom) of the cavity 165 and the upper surface of the substrate 112. At least one layer of the capacitor stack is used as an electrode of the capacitor 200.

According to this embodiment, the capacitor stack is a MIM stack 135 having three layers successively positioned above the wall of the cavity 165: a first layer of conductive and more particularly metal material 135a which forms at least in part a lower electrode of the capacitor 200, a second layer of insulating material 136a and a second layer of a conductive and more particularly metal material 135b which forms at least in part an upper electrode of the capacitor 200.

The MIM stack 135 may be deposited in a manner consistent with, for example, a full wafer deposition technique such as ALD (the acronym for "Atomic Layer Deposition"). Thus, the whole cavity 165 is covered by the MIM stack 135. The choice of materials for the two metal layers 135a and 135b is wide, for example, TiN, TaN, Ru, Cu, TiW, etc. These two layers may also be composed of a stack made of several materials. For the layer of insulating material 136a, an insulator having a good dielectric constant with and good resistance to breaking should be chosen, such as Al2O3, ZrO2, HFO2, Ta2O5. A combination of the dielectric may also be performed to improve the properties of the insulator.

It should be noted that in other embodiments, the layer 115 located above the wall of the cavity 165 and under the first layer of a metallic material 135a, may be considered as a layer of the capacitor stack and performed at this stage.

Figure 2D:
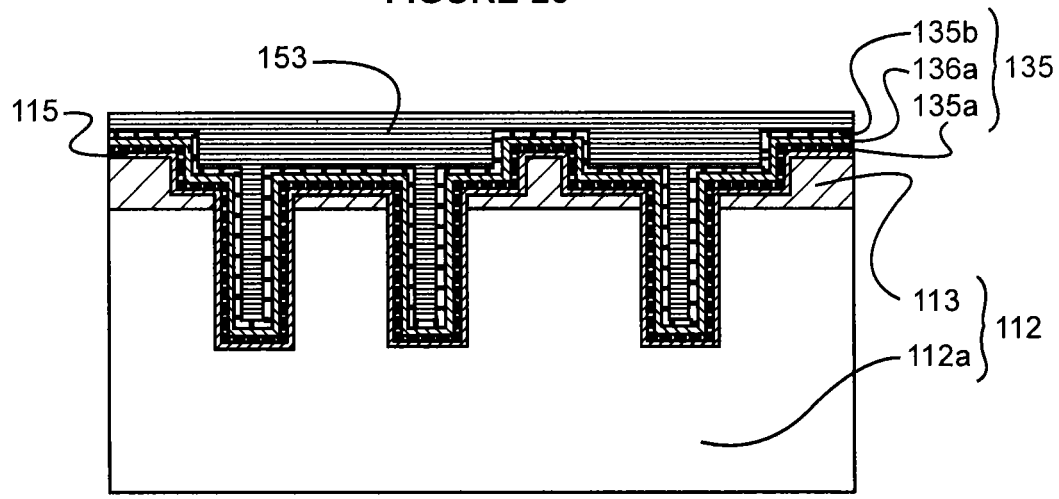
Figure 2E:
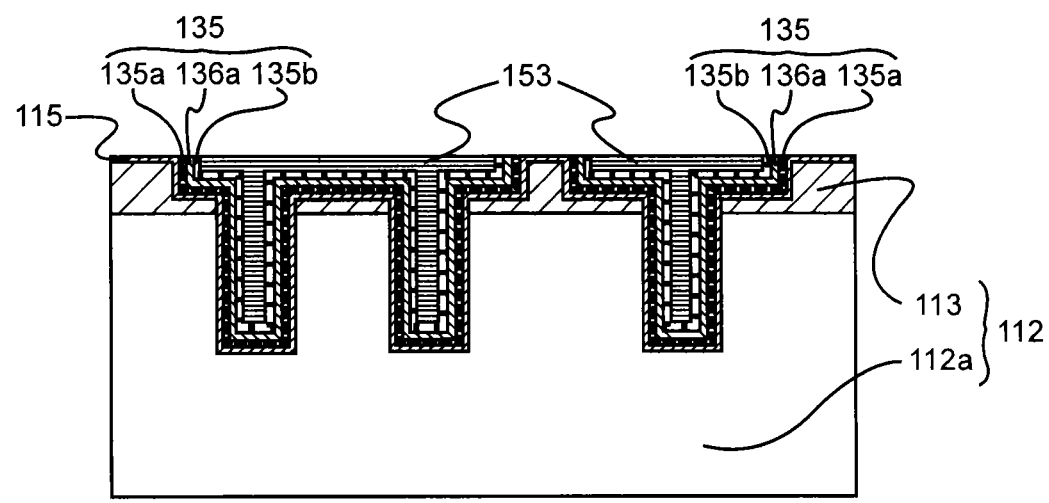

FIG. 2d illustrates the capacitor forming structure upon completion of the step 340. The step 340 is an optional step which consists in filling a residual space of the cavity 165 from the upper face of the substrate 112 with a filling material 153. More precisely, to ensure a better conduction of the upper electrode of the capacitor 200, the at least one trench 164 and advantageously the box 163 too, may be completely or partly filled by electrolysis (electrochemical deposition) ECD, with the filling material 153 which is for example a conductive metal such as copper or tungsten or polysilicon. The filling material 153 may be conductive (e.g. a metal or a conductive polymer) as well as insulating (e.g. an insulating polymer).

The layer 135b designated to form the upper electrode of the capacitor 200 may be used as a continuous background for generating the filling material 153.

Then, FIG. 2 illustrates the capacitor forming structure upon completion of the step 350. The step 350 consists in removing any remaining material on the surface of the upper face of the substrate 112. According to this embodiment, said material comprising the material of the MIM stack 135 and the filling material 153 is removed using a planarization method, such as a chemical-mechanical polishing or mechanical CMP, the acronym for "Chemical Mechanical Polishing".

Figure 2F:
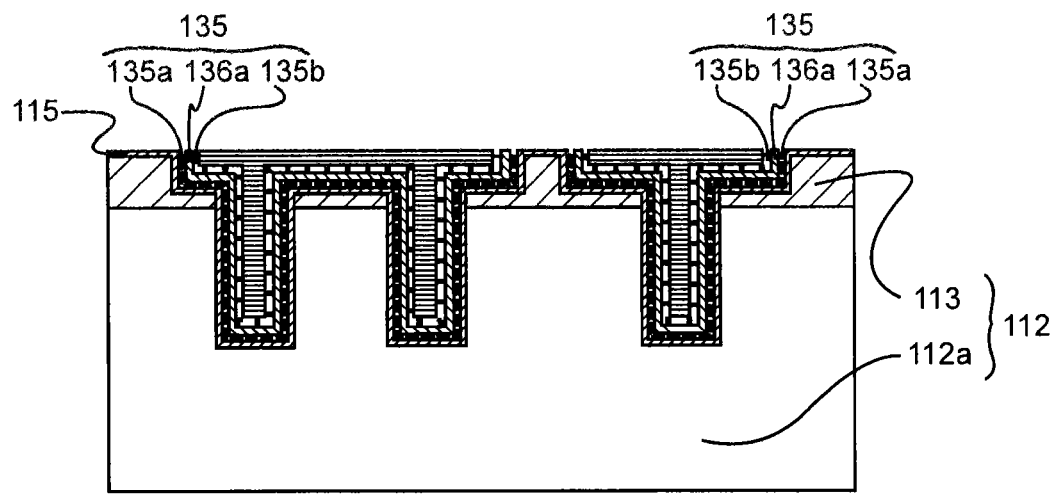

FIG. 2f illustrates the capacitor forming structure upon completion of the step 360. The step 360 consists in selectively removing at least one layer of metallic material which is used as an electrode of the capacitor 200. More specifically, according to the present embodiment, the two layers of metallic material 135a and 135b are etched from said upper surface so that the two layers of metallic material 135a and 135b stop at a level lower than that of the layer of insulating material 136a according to the thickness of the portion of the substrate 112.

This step is executed in order to avoid possible short circuits between the electrodes after the last step 350. This is a metal etching to remove the debris, the filaments, etc., which may still be present on said upper surface.

Figure 2G:
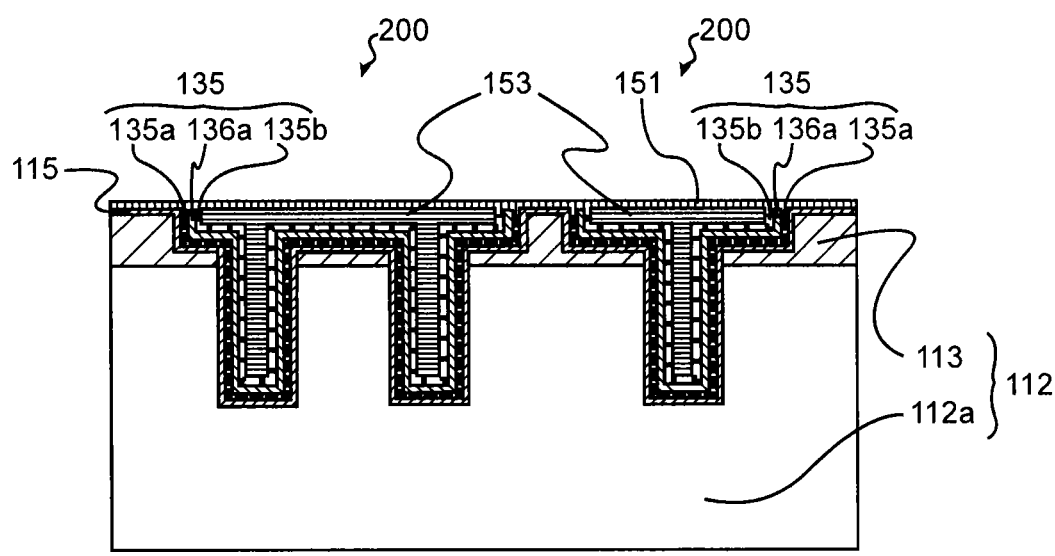

FIG. 2g illustrates the capacitor forming structure upon completion of the step 370. The step 370 consists in depositing a passivation layer 151 covering the upper surface of the portion of the substrate 112 and contacting the ends of the layers 135a, 136a and 135b. The material of the passivation layer 151 is for example a dielectric material such as SiN or SiO2. At this stage, the method may either extend on the upper face with additional levels of metals on the surface of the passivation layer 151, or extend on the back face (the face opposite the upper face of the substrate 112) after thinning to come into contact with the lower electrode of the capacitor 200.

FIG. 2g illustrates the structure of the capacitor 200 upon completion of all the steps according to the first embodiment of the present invention.

The stack 115, 135a, 136a, 135b matches the shape of the cavity, namely the shape of the trench and the shape of the box: the length of the capacitor stack and thus the capacitor is thus artificially increased and the reconnection of each electrode is thus facilitated.

Figure 3:
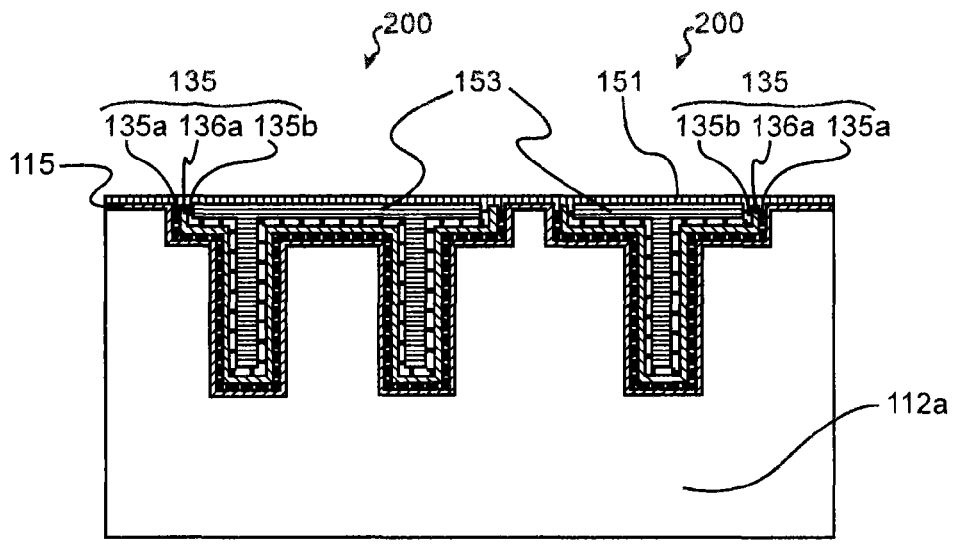
FIG. 3 illustrates the structure of a MIM capacitor 600 according to a second embodiment of the present invention.

FIG. 3 illustrates another capacitor structure without the surface layer of the substrate 113, as mentioned in the description relating to the step 310, according to a second embodiment.

Figure 4:
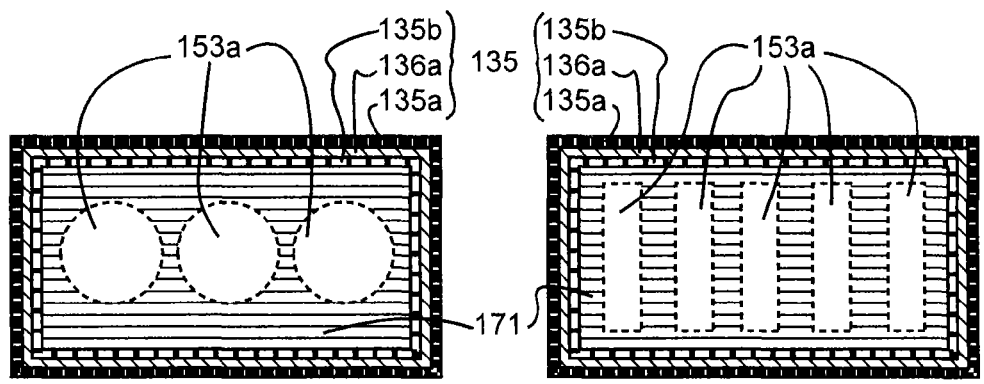
FIG. 4 shows a top view of the capacitor having two different types of trenches: holes having a circular section (left) and slots having a rectangular section (right).

One advantage is that the MIM stack 135 on the surface will be removed in the area outside the box 163 only, which thus precisely defines the outline of the capacitor 200. In other words, the part 171 of the MIM stack 135 located in the region outside the box 163 is the recovered planar capacitor. This is illustrated in FIG. 4 which shows a top view of the capacitor 200. Two types of trenches 164 are shown in FIG. 4: holes having a circular section (left) and slots having a rectangular section (right). The number of trenches is not limited.

The gain in capacitance corresponding to the planar surface 200 of the capacitor preserved by the box 163 easily ranges between 7% and 18%.

We can see that the gain in capacitance is significant, approximately 18%, in the case of a standard design (6 μm round hole, 10 μm distance). In the case of a very aggressive design (a 6 μm round hole, 5 μm distance), the recovered planar capacitance amounts to 7% since the contribution of the vertical wall of the cavity 165 is more important. This is all the more accentuated when the cavity 165 is deep. A minimum average gain in capacitance can be estimated at about 10% for a typical depth of the cavity 165 of about 80 μm. In addition, the method makes it possible to use a wide range of materials, even the most advanced ones such as high-k dielectrics, regardless of the burning thereof through CMP polishing.

Figure 5:
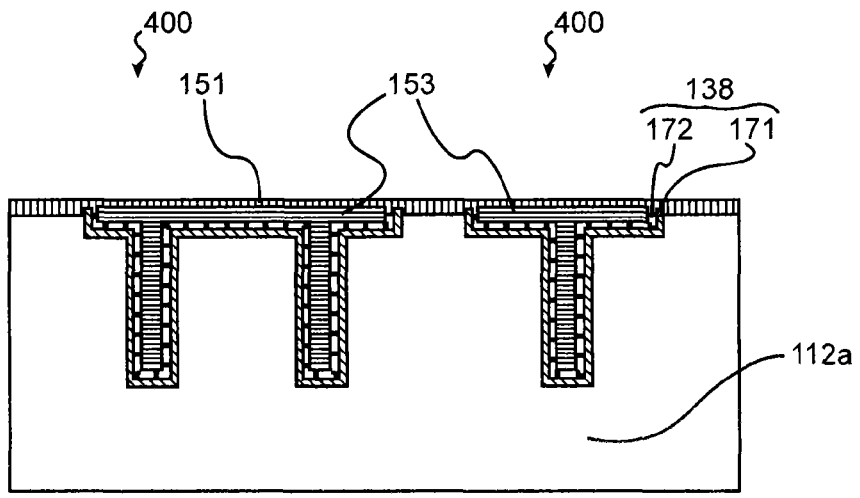
FIG. 5 illustrates the structure of a Metal-Insulator-Semiconductor (MIS) capacitor of a third embodiment according to the present invention.

FIG. 5 illustrates the structure of a capacitor 400 of a third embodiment according to the present invention. The present invention is also suitable for the case where a substrate 112 is also used as the lower electrode of the capacitor 400. The capacitor 400 is then a MIS (Metal-Insulator-Semiconductor) capacitor. In this case, the silicon substrate 112 must be doped to ensure a correct conduction.

In steps 310 and 320, a box 163 and at least one trench 164 are etched directly into the substrate 112 to form a cavity 165. After completion of steps 330 to 370, a capacitor stack 138 is deposited onto the surface of the substrate 112 and onto the wall of the cavity 165. The stack 138 comprises, successively above the wall of the cavity 165, a layer of metallic material 171 which is used as the upper electrode of the capacitor 400 and a layer 172, for example of insulating material.

Figure 6:
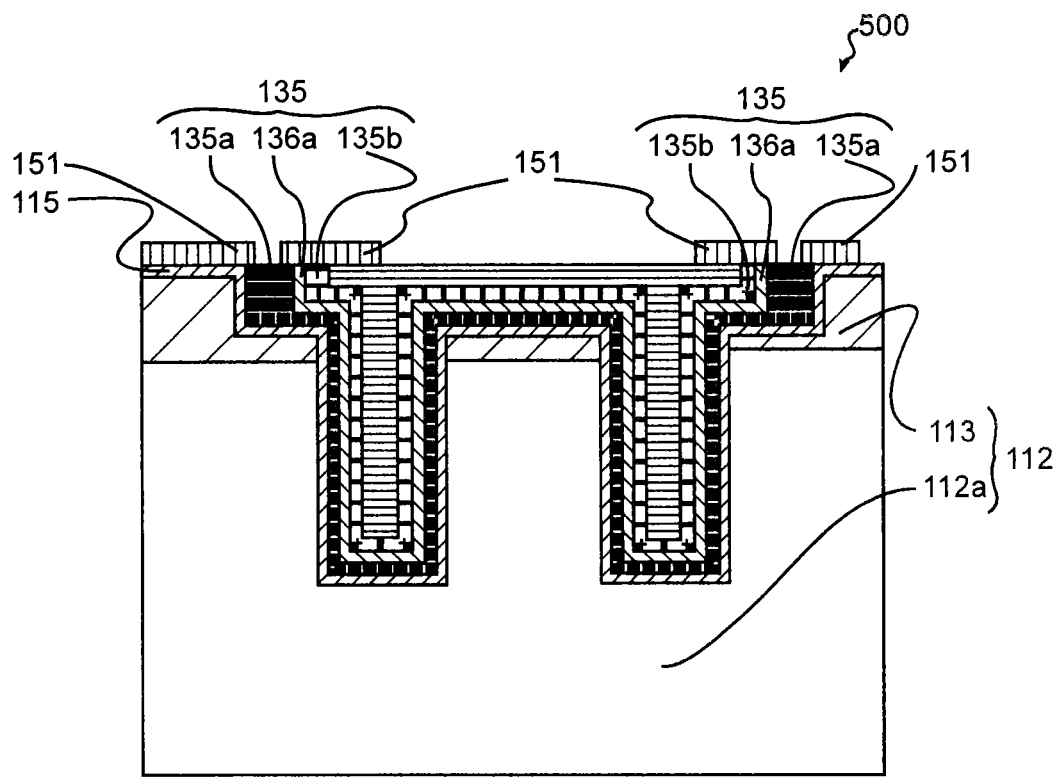
FIG. 6 illustrates the structure of a capacitor with a non-conforming deposition according to a fourth embodiment of the present invention.

The present invention also enables a non-conforming deposition of at least one layer used in forming a capacitor stack. A capacitor 500 formed by a non-conforming deposition is illustrated in FIG. 6.

The only difference between the capacitor 200 of the first embodiment and the capacitor 500 of this fourth embodiment is the size of the thickness E1 of the layer of metal material 135a in a transverse direction in the box 163. In the capacitor 200, the thickness E1 is equal to the thickness E2 of the layer of metal material 135a in at least one trench 164. On the contrary, in the capacitor 500, the thickness E1 is greater than the thickness E2 in the at least one trench 164. This enables to contact the MIM stack 135 from the front face only.

The non-conforming deposition of the layer of metal material 135a, in step 330 according to the method, may also consist of the following two steps:
 a conforming deposition to reach the bottom of a trench 164; then
 a thick non-conforming deposition to widen the connection surface at the surface of the substrate 112.

Figure 7:
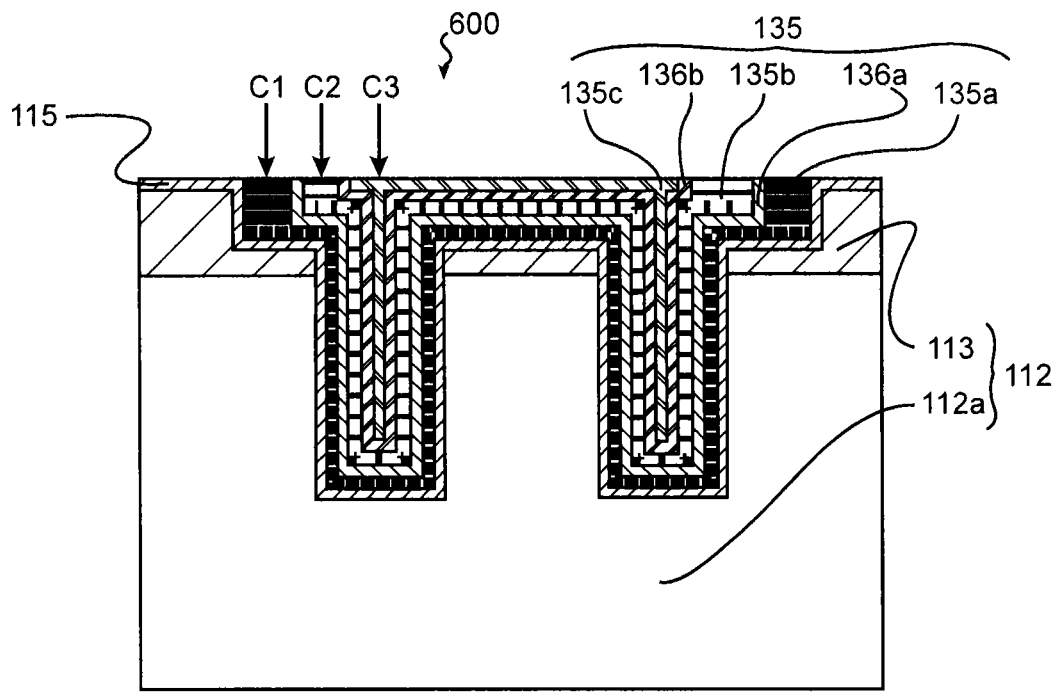
FIG. 7 illustrates the structure of a non-conforming MIMIM capacitor of a fifth embodiment according to the present invention.

Moreover, repeating the step 330 enables a capacitor stack consisting of a plurality of capacitors in the cavity 165. This increases the integrated capacitance accordingly. FIG. 7 illustrates the structure of a capacitor 600 of a fifth embodiment according to the present invention.

According to this embodiment, upon completion of the deposition of a capacitor stack composed of layers 135a, 135b and 136a, the step 330 further comprises the forming of an additional capacitor stack by successive depositions, above the layer of metal material 135b, of an additional layer of insulating material 136b, and of an additional layer of conductive, and specifically metallic, material 135c. In addition, the layers of metallic material 135a and 135b are preferentially deposited in a non-conforming way.

The layer of metal material 135a and the additional layer of metal material 135c are electrically connected so as to form at least in part a lower electrode of the capacitor 600. The layer of metallic material 135b is used as the upper electrode of the capacitor 600. The three reconnections on the surface of the box 163, respectively C1, C2 and C3 are shown in FIG. 7.

The box 163 plays a key role since it enables the widening of very thin electrodes, for example 100 nm, in the cavity 165 toward a macroscopic contact (e.g. 1 μm) enabling the electrical contact therewith. Without the box 163, said widening would not be possible since it would lead to a confinement of the layers of the capacitor stack and of the additional capacitor stack themselves into the at least one trench 164.

It therefore seems possible to stack a very large number of times, additional capacitor stacks in the at least one trench 164. The reconnection then occurs only at the edge of the box 163. By connecting capacitors in parallel, i.e. all the contacts C1 and C3 relative to contact C2, a very large capacity that has many applications, such as power management, filtering, and decoupling, etc. . . . is provided. By connecting in parallel at least two capacitors the total value of the capacitors formed in the cavity can thus be increased.

Figure 8:
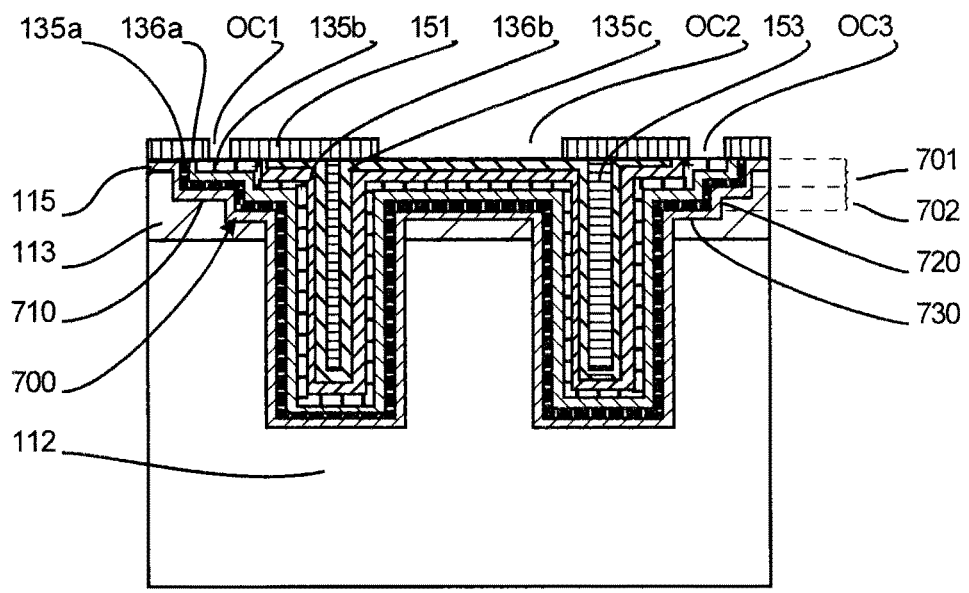
FIG. 8 shows another embodiment of the invention with a different box structure.

FIG. 8 illustrates another embodiment of the invention wherein the box 163 has a side wall 700 flaring toward the box outlet and having a non-zero component along the thickness of the substrate 112. In the case shown, the bottom wall of the box 163 and the side wall 700 together define the internal volume of the box 163. In the case illustrated in FIGS. 2 to 7, the side wall 700 is oriented strictly along the thickness of the substrate 112. On the contrary, in the case of FIG. 8, the side wall 700 is not oriented strictly along said thickness. The side wall 700 thus has a flared profile so that the base dimension thereof, at the trench outlet is smaller than the highest dimension at the box outlet. In FIG. 8, the substrate 112 is not used as the lower electrode but the principle of stages and capacitor stacks mentioned above may be applied to the stages in this alternative embodiment.

It should be noted that the profile of the side wall 700 of FIG. 8 is a representative but non-limiting embodiment. Other profiles so configured as to flare the box 163 towards the face of the substrate 112 or making it possible to accommodate a larger number of capacitive layers may be considered without departing from the scope of the invention.

In the example of FIG. 8, the cross-section of the box is increasing with the distance from the bottom wall of the box. This increase occurs not restrictively like in FIGS. 8 and 9 because of the landings 710. Each landing 710 defines two stages 701 and 702 on either face of the considered landing 710. The landings 710 are advantageously obtained by etching during the global forming of the box 163. They preferably comprise a horizontal portion 730 extending the box section between two stages 701 and 702, toward the face of the substrate 112. Side parts 720 provide the rising portions of the box in this example.

The stages 701 and 702 are thus defined by the transverse parts 730 and also by vertical parts 720 (oriented along the thickness of the substrate 112) in the illustrated case wherein the stages are crenel-shaped.

It should be understood that, without removing matter too deeply, this landings- or tapered configuration provides a significant widening of the box 163 and the forming of an enlarged box outlet.

This advantage is of particular interest when executing additional capacitor stacks. As a matter of fact, the overall dimensions of the contact on the surface even less interferes with the number of capacitor stacks than in the embodiments of FIGS. 2 to 7.

In FIG. 8, an additional capacitor stack has been executed as in FIG. 7, with a filling material 153 being added to complete the manufacture. Two box stages 701, 702 are formed around a landing 710 so as to best accommodate the internal volume of the box 163 for receiving the successive layers of the capacitor stacks.

The stage 701 is directly under the face 12 of the substrate 1 and has a depth dimension adapted to accommodate the size of the stack corresponding thereto. The same goes for the next stage 702. A succession of layers of the first conductor (electrode)/insulator/second conductor (electrode) type corresponds to one stage with a conductor being common between two successions of layers of two successive stages. More specifically, the depth of a stage is advantageously so arranged as to be smaller than the thickness of its first electrode added to the thickness of its insulator, and/or greater than the thickness of the entire succession of first conductor (electrode)/insulator/second conductor (electrode) layers. In other words, for a n stage, the depth is preferably such that:

"Thickness (conductor+n insulator" is smaller than "n stage depth" which is smaller than or equal to "Thickness (n conductor+n insulator+n+1 conductor)."

Thus, as regards the stage 701, depth is selected according to the thicknesses of the layers of the capacitor stack. As regards the next stage 702, depth is based on the thicknesses of the next additional capacitor stack and on the thickness of the electrode of the previous stack. Previous means that the stack in question has been achieved by the depositions just preceding those of the next stack.

The stages may then have various depths according to the specific thicknesses of the various successive layers of the stacks.

It should be noted that the depositions are advantageously so arranged as to conform to the profile of the side wall 700 so that, for each capacitor stack deposition, a residual space is preserved for receiving the following stack.

The steps 350 and 370, as illustrated above, are then performed prior to forming contact openings OC1, OC2, OC3.

The step 350 may include a planarization such as CMP polishing to remove the layers of conductive material 135*a*, 135*b*, 135*c* at the surface of the substrate 112.

The step 370 comprises the deposition of a dielectric passivation layer 151, for example, of the SiO2 or SiN type over the planarized electrodes 135*a*, 135*b*, 135*c*. This step 370 may be executed for example by PECVD (the acronym for "Plasma-enhanced chemical vapor deposition").

The invention is not limited to the planarization methods and is not limited either to the materials or methods of forming the passivation layer 151.

Next, a lithography step and an etching step are successively performed at the passivation layer 151 to form the contact openings OC1, OC2, OC3.

The step of lithography is carried out for example conventionally. A hard mask is deposited onto the upper surface of the substrate 112 outside the areas intended to form the contact openings OC1, OC2, OC3. The alignment is made possible by the dimension of the box 700, more specifically, the alignment is easily achieved thanks to the dimensions of the box stages 701, 702 and to those of the landings 710, 720, 730, which have a side of several microns.

The step of etching consists in etching the passivation layer 151 and thus leading to each electrode 135*a*, 135*b*, 135*c*. The contacts openings OC1, OC2, OC3 are thus formed.

The step of forming the electrode contacts will be described later.

The invention is not limited to lithography or etching methods.

Figure 9:
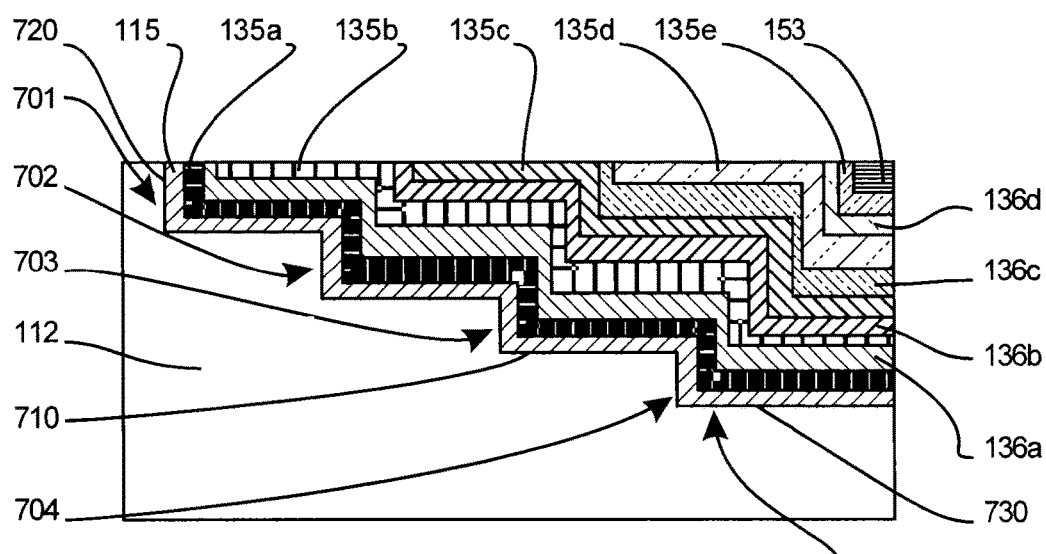
FIG. 9 shows a variant of FIG. 8.

FIG. 9 shows a variant of FIG. 8 with a partial view of a capacitor provided with a box having stages 701, 702, 703, 704. Four electrodes made here of the layers of conductive material 135*a, b, c, d, e* correspond to the four stages. The number of stages is not limited.

It is thus possible to perform multiple stages fitted to one another, in order to produce a multiple tri-layer stack of the MIM type. Each electrode 135*a*, 135*b*, 135*c*, 135*d* may be associated with a stage, with the last deposited electrode 135*e* not requiring a stage.

Under the above conditions relative to the thickness, it is possible to expose all the electrodes in one operation with a single step of CMP. The significant advantage lies in the contact surface of each electrode which is equivalent to the width (transverse dimension) of the associated stage. Even the thin electrodes (tens of nm) can thus be contacted from the front face thanks to the development of a stage the width of which can be chosen, typically greater than 1 µm. The multiple photolithography and etchings of the stages are easily executed from the face, prior to the deposition of MIM.

This method makes it possible to obtain n vertical capacitors in series when reconnection takes place independently of each other and/or in parallel when all or part of such capacitors are short-circuited.

The embodiments described with reference to FIGS. 8 and 9 show that the shape of the box 163 may vary and in particular have a side wall profile differing from a straight wall perpendicular to the face of the substrate 112. The landing-profile of FIGS. 8 and 9 is only an example of the plurality of possible profiles for the box 163. Generally speaking, other profiles configured to flare the box 163 toward the face of the substrate 112 are possible.

Figure 10:
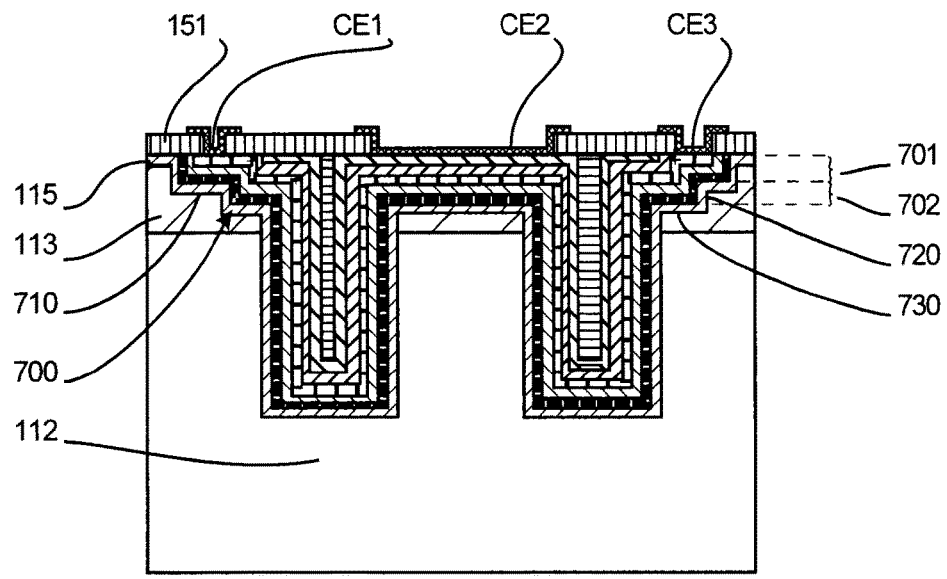
FIG. 10 shows the embodiment with the box structure illustrated in FIG. 8 after the forming of electrode contacts.
Figure 11:
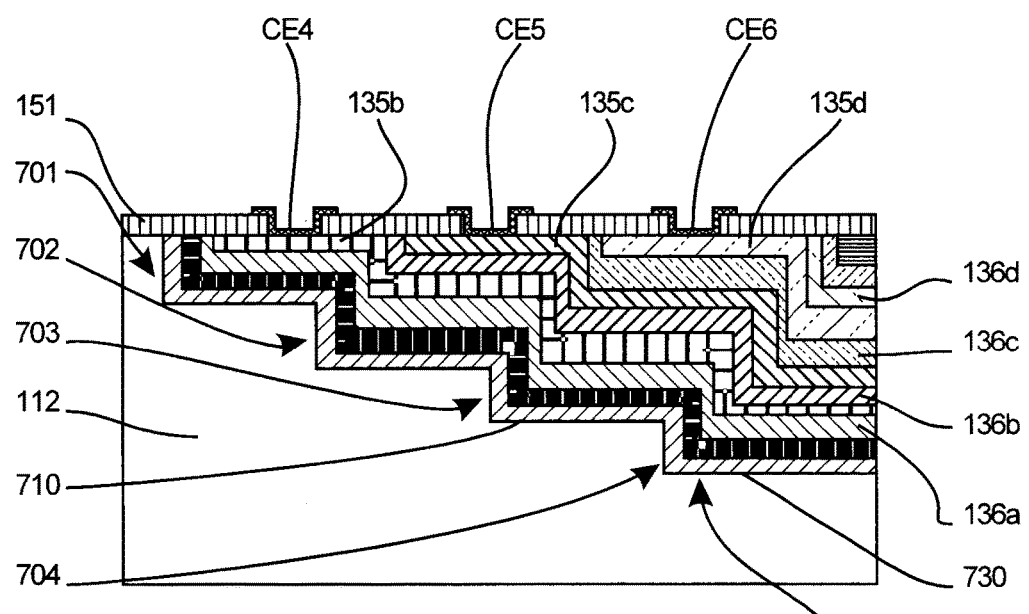
FIG. 11 shows the embodiment with the box structure illustrated in FIG. 9 after the forming of electrode contacts.

FIG. 10 shows the embodiment with the box structure 700 illustrated in FIG. 8 after forming electrode contacts CE1, CE2 and CE3. Similarly, FIG. 11 shows the embodiment with the box structure 700 illustrated in FIG. 9 after forming electrode contacts CE4, CE5 and CE6.

The embodiment illustrated in FIGS. 8 and 10 will now be examined. After the forming of the contact openings OC1, OC2, OC3 described above, a metal layer such as an aluminium layer is deposited onto the upper surface of the substrate 112; i.e. a metal layer is deposited in the contact openings OC1, OC2, OC3 and above the passivation layer 151.

Next, a step of lithography and a step of etching are successively performed at said metal layer to form the electrode contacts CE1, CE2, CE3.

The step of lithography is carried out for example conventionally. A hard mask is deposited onto said metal layer to cover and protect the contact openings OC1, OC2, OC3. The step of etching is then performed to remove portions of the metal layer not covered by the hard mask while keeping portions of the metal layer covering the openings contacts OC1, OC2, OC3. These portions of the metal layer left behind have become the electrode contacts CE1, CE2, CE3, as illustrated in FIG. 10.

It should be noted that the electrodes 135*a*, 135*b*, 135*c* may also be connected together through said metal layer if it is desired to put the capacitors in parallel directly.

Furthermore, since the whole capacitor stack comprising the layers 135*a*, 136*a*, 135*b*, 136*b*, 135*c* is formed in the thickness of the substrate 112 itself, an electrical connection can be executed by forming electrode contacts on the rear face of the substrate 112 (the one opposite the upper face of the substrate 112) after thinning or forming an electrical access to contact the lower electrode of the capacitor.

The invention therefore enables a reconnection of the electrodes from the upper face (optionally in association with reconnection from the rear face) of all the layers of conductive material 135*a, b, c* (or 135*a, b, c, d, e*) as described in the embodiments above. This results in a larger total capacitance being developed not only vertically but also horizontally, which is a significant advantage of the invention.

The present invention is not limited to the above described embodiments but applies to any embodiment complying with its spirit.

The invention claimed is:

1. A method for producing a capacitor stack in a portion of a substrate, the method comprising:
    forming a cavity along a thickness of the portion of the substrate from an upper surface of the substrate;
    depositing a plurality of layers for the capacitor stack onto a wall of the cavity and onto the upper surface of the substrate, the deposited plurality of layers covering the upper surface and including a first layer of conductive material configured to form at least part of an upper electrode of the capacitor stack;

forming at least one additional capacitor stack by successive depositions, above the first layer of conductive material, of a first layer of insulating material and a second layer of conductive material; and removing material from the deposited plurality of layers covering said upper surface, and from the successive depositions, until the upper surface of the substrate is reached, wherein the forming of the cavity comprises forming at least one trench and, associated with the at least one trench, at least one box, the at least one trench comprising a trench outlet that opens into the at least one box, the at least one box comprising a box outlet that opens at the surface of the upper surface, and the box outlet being shaped so as to be larger than the trench outlet.

2. The method according to claim 1, wherein the forming the at least one box comprises forming a bottom wall of the at least one box located in a same plane as the trench outlet and having a larger section than that of the trench outlet.

3. The method according to claim 2, wherein the at least one box is formed as a rectangular parallelepiped or is cylindrical.

4. The method according to claim 1, wherein the at least one trench is formed with a circular cross-section transverse to a thickness direction of the substrate.

5. The method according to claim 1, wherein the at least one trench is formed with a rectangular or square cross-section transverse to a thickness of the substrate.

6. The method according to claim 1,
wherein the at least one box is formed with an aspect ratio smaller than 1 between a dimension of the at least one box along the thickness of the portion of the substrate and a dimension transverse to a direction of the thickness, and
wherein the at least one trench is formed with an aspect ratio greater than 1 between the dimension along the thickness of the portion of the substrate and the dimension transverse to the direction of the thickness.

7. The method according to claim 1, wherein the deposited plurality of layers for the capacitor stack comprises, successively above the wall of the cavity, a third layer of conductive material configured to form at least a part of a bottom electrode of the capacitor stack; a second layer of insulating material; and the first layer of conductive material configured to form the at least part of the upper electrode of the capacitor stack.

8. The method according to claim 7, further comprising etching partially the first layer of conductive material and the third layer of conductive material so that the first and the third layers of conductive material stop at a lower level than that of the second layer of insulating material along a thickness direction of the substrate.

9. The method according to claim 7, wherein the deposited plurality of layers further comprises a third layer of insulating material located above the wall of the cavity and under the third layer of conductive material.

10. The method according to claim 1,
wherein a lower electrode of the capacitor stack is at least partly formed from the portion of the substrate, and
wherein the deposited plurality of layers comprises, successively above the wall of the cavity, a second layer of insulating material and the first layer of conductive material configured to form the at least part of the upper electrode of the capacitor stack.

11. The method according to claim 10, further comprising etching partially the first layer of conductive material so that the first layer of conductive material stops at a lower level than that of the second layer of insulating material along a thickness direction of the substrate.

12. The method according to claim 1, wherein the forming the at least one box comprises forming a flared box side wall flaring towards the box outlet.

13. The method according to claim 12, wherein the forming a flared box side wall comprises forming, on the flared box side wall, at least one landing at an intermediate level between the trench outlet and the box outlet along the thickness of the portion of the substrate, with the at least one landing configured to define two box stages.

14. The method according to claim 13, wherein the successive depositions to form the at least one additional capacitor stack are configured to preserve a residual space defined by the additional capacitor stack.

15. The method according to claim 14, wherein as many box stages as capacitor stacks are formed.

16. The method according to claim 15,
wherein the at least one additional capacitor stack is formed above the first layer of conductive material to form at least in part the upper electrode of the capacitor stack,
wherein a depth of a stage located directly under the box outlet along the thickness of the portion of the substrate is:
greater than a sum of a thickness of the lower electrode of the capacitor stack and of the second layer of insulating material, and
less than or equal to a thickness of the capacitor stack; and
wherein a depth of another stage located directly under the stage located directly below the box outlet along the thickness of the portion of the substrate is:
greater than a sum of thicknesses of the upper electrode of the capacitor stack and of the first layer of insulating material of the at least one additional capacitor stack, and
less than or equal to a sum of thicknesses of the at least one additional capacitor stack and of the upper electrode of the capacitor stack.

17. The method according to claim 16, further comprising forming at least one second additional capacitor stack over the at least one additional capacitor stack,
wherein, for each second additional capacitor stack of the at least one second additional capacitor stack, an additional stage is formed at a greater depth level relative than that of an upper stage corresponding to a previous additional capacitor stack, with a depth of the additional stage being:
greater than a sum of thicknesses of an additional layer of conductive material of the previous additional capacitor stack and of an additional layer of insulating material of the at least one second additional capacitor stack, and
less than or equal to a sum of thicknesses of said at least one second additional capacitor stack and of an additional layer of conductive material of the previous additional capacitor stack.

18. The method according to claim 1, wherein the third layer of conductive material and the second layer of conductive material of the at least one additional capacitor stack are electrically connected to form a lower electrode.

19. The method according to claim 1, wherein the substrate and the second layer of conductive material of at the least one additional capacitor stack are electrically connected to form a lower electrode.

20. The method according to claim 1, wherein the deposited plurality of layers comprises a non-conforming deposition of at least one layer.

21. The method according to claim 20, wherein the non-conforming deposition is configured such that a deposition thickness of the at least one layer in the at least one box is greater in a direction transverse to a thickness direction of the substrate than that of a deposition thickness of the at least one layer in the at least one trench.

22. The method according to claim 1, further comprising:
from the upper surface, depositing a filling material to fill a residual space of the cavity after the deposition of the plurality of layers; and
removing the deposited filling material until the upper surface of the substrate is reached.

23. The method according to claim 22, wherein the removing the deposited filling material comprises performing planarization by chemical-mechanical polishing or mechanical polishing.

24. The method according to claim 22, wherein the filling material is a conductive material.

25. The method according to claim 1,
wherein the portion of the substrate is formed in part with a surface layer of the substrate being deposited on a bottom layer of the substrate prior to the forming of the cavity, and
wherein a depth of the at least one box along a thickness direction of the substrate is smaller than a thickness of the surface layer.

26. A method for producing a capacitor stack in a portion of a substrate, the method comprising:
forming a cavity along a thickness of the portion of the substrate from an upper surface of the substrate;
depositing a plurality of layers for the capacitor stack onto a wall of the cavity and onto the upper surface of the substrate, the deposited plurality of layers covering the upper surface and including a first layer of conductive material configured to form at least part of an upper electrode of the capacitor stack;
forming at least one additional capacitor stack by successive depositions, above the first layer of conductive material, of a first layer of insulating material and a second layer of conductive material; and
removing material from the deposited plurality of layers covering said upper surface, and from the successive depositions, until the upper surface of the substrate is reached,
wherein the forming of the cavity comprises forming at least one trench and, associated with the at least one trench, at least one box, the at least one trench comprising a trench outlet that opens into the at least one box, the at least one box comprising a box outlet that opens at the surface of the upper surface, and the box outlet being shaped so as to be larger than the trench outlet, and
wherein the forming of the at least one box comprises forming a flared box side wall flaring towards the box outlet.

* * * * *